US012424234B2

(12) United States Patent
Tsingos et al.

(10) Patent No.: US 12,424,234 B2
(45) Date of Patent: Sep. 23, 2025

(54) OPTIMIZATION FOR TECHNICAL TARGETS IN AUDIO CONTENT

(71) Applicant: Lucasfilm Entertainment Company Ltd. LLC, San Francisco, CA (US)

(72) Inventors: Nicolas Tsingos, San Francisco, CA (US); Scott Levine, San Anselmo, CA (US); Stephen Morris, San Francisco, CA (US)

(73) Assignee: Lucas Entertainment Company Ltd. LLC, San Francisco, CA (US)

( * ) Notice: Subject to any disclaimer, the term of this patent is extended or adjusted under 35 U.S.C. 154(b) by 353 days.

(21) Appl. No.: 17/878,659

(22) Filed: Aug. 1, 2022

(65) Prior Publication Data
US 2024/0038256 A1 Feb. 1, 2024

(51) Int. Cl.
G10L 21/0316 (2013.01)
G10L 25/21 (2013.01)

(52) U.S. Cl.
CPC .......... *G10L 21/0316* (2013.01); *G10L 25/21* (2013.01)

(58) Field of Classification Search
CPC .................................................... G06F 16/683
USPC .......................................................... 700/94
See application file for complete search history.

(56) References Cited

U.S. PATENT DOCUMENTS

| | | | | |
|---|---|---|---|---|
| 2012/0185769 A1* | 7/2012 | Whitley | ................. | H04S 7/303 381/17 |
| 2013/0196292 A1* | 8/2013 | Brennen | ................ | G09B 19/06 434/156 |
| 2016/0078879 A1* | 3/2016 | Lu | ............................ | G10L 21/02 381/56 |
| 2017/0127212 A1* | 5/2017 | Jot | ........................ | H03G 3/3089 |

* cited by examiner

*Primary Examiner* — Alexander Krzystan
(74) *Attorney, Agent, or Firm* — Sheppard Mullin Richter & Hampton LLP

(57) ABSTRACT

Some implementations of the disclosure relate to a non-transitory computer-readable medium having executable instructions stored thereon that, when executed by a processor, cause a system to perform operations comprising: obtaining a first energy-based target for audio; obtaining a first version of a sound mix including one or more audio components; computing, for each audio frame of multiple audio frames of each of the one or more audio components, a first audio feature measurement value; optimizing, based at least on the first energy-based target and the first audio feature measurement values, gain values of the audio frames; and after optimizing the gain values, applying the gain values to the first version of sound mix to obtain a second version of the sound mix.

9 Claims, 5 Drawing Sheets

OPTIMIZATION FOR TECHNICAL TARGETS IN AUDIO CONTENT

BRIEF SUMMARY OF THE DISCLOSURE

Implementations of the disclosure are directed to systems and methods for optimizing audio content for energy-based audio targets. In some cases multiple concurrent technical targets may be globally optimized for.

In one embodiment, a non-transitory computer-readable medium has executable instructions stored thereon that, when executed by a processor, cause a system to perform operations comprising: obtaining a first energy-based target for audio; obtaining a first version of a sound mix including one or more audio components; computing, for each audio frame of multiple audio frames of each of the one or more audio components, a first audio feature measurement value; optimizing, based at least on the first energy-based target and the first audio feature measurement values, gain values of the audio frames; and after optimizing the gain values, applying the gain values to the first version of sound mix to obtain a second version of the sound mix.

In some implementations, optimizing, based at least on the first energy-based target and the first audio feature measurement values, the gain values comprises: initializing the gain values; and iteratively: updating, based on the gain values, the first audio feature measurement values to obtain updated first audio feature measurement values computing, based at least on the first energy-based target and the updated first audio feature measurement values, a value of a loss function; after computing the loss function, updating the gain values; and determining if a maximum number of iterations has been reached, or that the first energy-based target is satisfied after updating the gain values.

In some implementations, the operations further comprise: obtaining a second energy-based target for audio; and computing the value of the loss function comprises: computing, based at least on the first energy-based target, the second energy-based target, and the updated first audio feature measurement values, the value of the loss function.

In some implementations, the loss function comprises a weighted sum of a first function based on the first energy-based target and a second function based on the second energy-based target.

In some implementations, the first energy-based target corresponds to an overall program loudness; and the second energy-based target corresponds to a dialogue loudness.

In some implementations, the one or more audio components comprise multiple audio components.

In some implementations, the operations further comprise: computing a relative energy balance between the multiple audio components; and optimizing the gain values comprises: optimizing the gain values based at least on the first energy-based target, the first audio feature measurement values, and the relative energy balance.

In some implementations, optimizing the gain values, comprises: minimizing a change in the relative energy balance while meeting the first energy-based target.

In some implementations, the multiple audio components comprise a first dialogue stem, a first music stem, and a first sound effects stem; and the second version of the sound mix comprises a second dialogue stem, a second music stem, and a second sound effects stem.

In some implementations, the first version of the sound mix corresponds to a first language; the operations further comprise computing a relative energy balance between multiple audio components of a third version of the sound mix corresponding to a second language; and optimizing the gain values comprises: optimizing the gain values based at least on the first energy-based target, the first energy measurement values, and the relative energy balance.

In some implementations, the first version of the sound mix comprises first pulse-code modulation (PCM) audio; the second version of the sound mix comprises second PCM audio; and applying the gain values to the first version of the sound mix comprises scaling multiple PCM samples of each of the audio frames based on a respective one of the gain values.

In some implementations, applying the gain values to the first version of the sound mix further comprises applying the gain values using a linear interpolation or overlap-add process.

In some implementations, each of the audio frames has a length of at least 1 millisecond (ms). In some implementations, each of the audio frames has a length of at least 2 ms, 3 ms, 4 ms, 5 ms, 6 ms, 7 ms, 8 ms, 9 ms, or 10 ms. In some implementations, each of the audio frames has a length of at least 20 ms, 30 ms, 40 ms, 50 ms, 60 ms, 70 ms, 80 ms, 90 ms, or 100 ms.

In some implementations, the first audio feature measurement value is a weighted short-term energy; and computing the first audio feature measurement value for each of the audio frames, comprises: computing the weighted short-term energy by integrating energy over a time window including at least the audio frame and an adjacent audio frame.

In some implementations, the operations further comprise: computing, for each audio frame of multiple audio frames of each of the one or more audio components, a second audio feature measurement value indicating a presence or absence of dialogue in the audio frame; and optimizing the gain values comprises: optimizing, based at least on the first energy-based target, the weighted short-term energies, and the second audio feature measurement values, the gain values.

In some implementations, the operations further comprise: dividing each of the one or more audio components into the multiple audio frames, the multiple audio frames each having a length of at least 1 millisecond.

In some implementations, the operations further comprise: prior to optimizing the gain values, applying a global gain shift to each of the multiple audio frames.

In one embodiment, a method comprises: obtaining, at a computing device, a first energy-based target for audio; obtaining, at the computing device, a first version of a sound mix including one or more audio components; computing, at the computing device, for each audio frame of multiple audio frames of each of the one or more audio components, a first audio feature measurement value; optimizing, at the computing device, based at least on the first energy-based target and the first audio feature measurement values, gain values of the audio frames; and after optimizing the gain values, applying, at the computing device, the gain values to the first version of sound mix to obtain a second version of the sound mix.

In one embodiment, a system comprises: one or more processors; and one or more non-transitory computer-readable mediums having executable instructions stored thereon that, when executed by the one or more processors, cause the system to perform operations comprising: obtaining a first energy-based target for audio; obtaining a first version of a sound mix including one or more audio components; computing, for each audio frame of multiple audio frames of each of the one or more audio components, a first audio feature measurement value; optimizing, based at least on the first energy-based target and the first audio feature measurement values, gain values of the audio frames; and after optimizing the gain values, applying the gain values to the first version of sound mix to obtain a second version of the sound mix.

Other features and aspects of the disclosed method will become apparent from the following detailed description, taken in conjunction with the accompanying drawings, which illustrate, by way of example, the features in accordance with embodiments of the disclosure. The summary is not intended to limit the scope of the claimed disclosure, which is defined solely by the claims attached hereto.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments of the disclosure.

Figure 1:
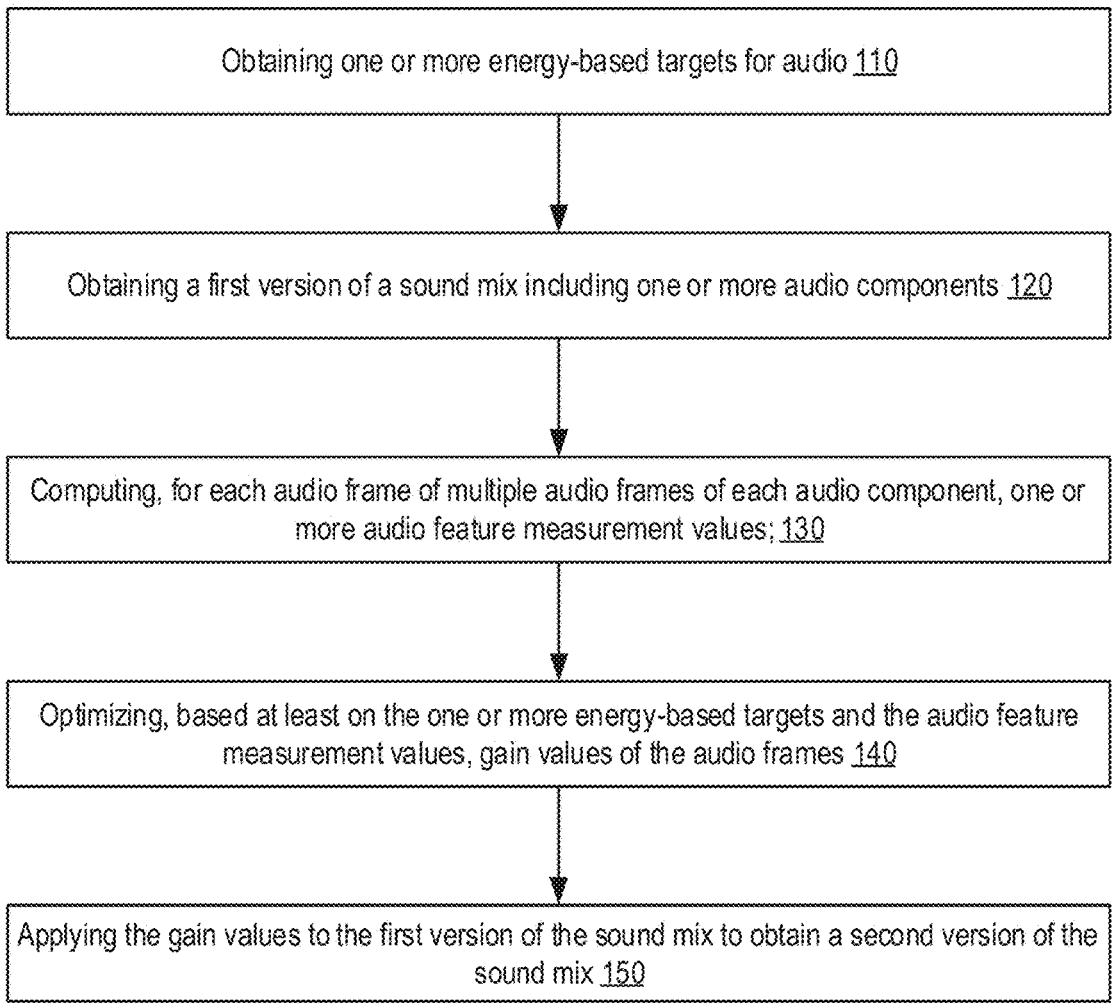
FIG. 1 is a flow diagram illustrating an example method of deriving a second version of a sound mix from a first version of the sound mix, given one or more energy-based targets for audio, in accordance with some implementations of the disclosure.

The figures are not exhaustive and do not limit the disclosure to the precise form disclosed.

DETAILED DESCRIPTION

Audiovisual content delivered to the home (e.g., via streaming services) preferably adheres to specific technical constraints or targets in order to provide a more consistent end-user experience across all available content. These technical constraints can include audio constraints such as, for example, dialogue and programme loudness constraints. In some cases, these constraints are mandated by the streaming services themselves. In some cases, these constraints are mandated by law (e.g., Commercial Advertisement Loudness Mitigation Act). Several standards, such as ITU-1770 or EBU R-128, have been developed to measure programme and dialogue loudness, and these standards are used to enforce compliance. Content is often originally mixed for an alternate presentation (e.g., large venue theatrical release), without these constraints in mind.

When a single audio target (e.g., programme loudness or dialogue loudness) needs to be reached, a simple solution is to measure the applicable value of the material according to the relevant standard and apply a global correction to the original audio PCM samples (e.g., applying a global gain correction to meet a single loudness target). Alternatively, it is also possible to apply short-term dynamic range compression to the program.

However, simultaneously meeting a combination of audio targets after the fact (e.g., both a specific dialogue and programme loudness) can be challenging. For instance, when both dialogue and programme loudness targets must be reached, the processing can be applied separately to different components of the material (e.g., music, sound effects and dialogue stems). However, in doing so, there is a strong risk of unbalancing these components and changing the artistic intent of the original soundtrack.

As multiple target specifications accumulate for media distribution, it becomes difficult, if nearly impossible, to achieve compliance utilizing existing tools in both the real-time and file-based domains. Traditional signal processing adjustments to conform the content to a given technical specification often counteract adherence to an adjacent specification, via both manual human adjustments, as well as static, blanket processing. As such, traditional workflows for correcting input audio to multiple technical targets involve human manual intervention using traditional signal processing tools. These workflows are not adapted to produce dynamic processing that solves for multiple target specifications, such as by correcting to multiple audio targets simultaneously across different components of soundtracks.

To address these and other limitations of present audio versioning systems, implementations of the disclosure are directed to systems and methods for optimizing for audio targets. In accordance with some implementations described herein, a soundtrack composed of one or more audio components can be ingested along with one or more desired audio targets, and time-domain instructions can be generated upon completion of the optimization. The optimization can be a global optimization performed in a manner that meets the required constraints of multiple targets while preserving measured characteristics of input media that can include cross relationships of multiple audio sources, such as an energy balance between different audio components.

To effectuate the optimization, the systems and methods described herein can be configured to: obtain one or more energy-based targets corresponding to one or more respective audio features or metrics (e.g., one or more targets values as specified in one or more standards or specifications); compute, for multiple audio frames of an input or original sound mix, audio feature measurement values needed to compute for energy-based targets (e.g., at least one energy measurement value and, optionally, an additional feature such as a binary dialogue mask); and optimize, based on the computed audio feature measurement values and one or more energy-based targets, frame-by-frame gain values to be applied to the sound mix; and applying the gain values to the sound mix to generate another version of the sound mix that conforms to the energy-based targets.

By virtue of optimizing in the domain of measured values of audio features, rather than raw audio data, values for multiple sets of audio features may be ingested and cross-referenced. As such, multiple parallel audio targets can be optimized for, rather than merely applying global offsets to raw audio data. Such an optimization approach can be far more efficient than analysis and processing of each raw audio or video sample, in some instances speeding up processing times by up to about three orders of magnitude. For example, the values of audio features can be computed at the scale of tens/hundreds of milliseconds (e.g., 10-50 Hz)

rather than at the scale of tenths/hundredths of milliseconds (e.g., 48 KHz) of the source PCM samples.

The techniques described herein could be leveraged by a studio or content creation enterprise to automate and/or optimize the soundtrack versioning process. Content creation, post production, finishing and/or distribution facilities could also benefit from both the increased efficiency as well as the aesthetic benefits provided by implementing the systems and methods described herein. Similarly, the audio and video software tools utilized by such facilities could benefit from the optimization approach described herein to enable adaptability to various content types and specifications.

FIG. 1 is a flow diagram illustrating an example method 100 of deriving a second version of a sound mix from a first version of a sound mix, given one or more energy-based targets for audio, and one or more audio feature measurement values of the sound mix, in accordance with some implementations of the disclosure. For example, given an original movie sound mix (e.g., mix of dialogue, music, and sound effects) that is created in English in a DOLBY ATMOS theater format or other theater format, method 100 may be used to derive a second version of the sound mix that complies with energy-based targets prescribed for other formats (e.g., DOLBY ATMOS home, 5.1 surround sound, 7.1 surround sound, DTS-HD, Stereo, Binaural, etc.). Method 100 will be described with reference to FIG. 2, which conceptually illustrates a particular implementation of method 100 with multiple energy-based targets and a sound mix having multiple input PCM stems 10-1 to 10-N (collectively "PCM stems 10").

Operation 110 includes obtaining one or more energy-based targets for audio. The one or more energy-based targets may be constraints mandated by a streaming service, constraints mandated by law or regulation, and/or constraints mandated by the party that developed the content (e.g., a studio). The one or more energy-based targets may be one or more values that are retrieved from a local datastore of energy-based targets. Alternatively, the one or more energy-based targets may be one or more values that are retrieved from a remote datastore or derived given a specification.

For instance, the one or more energy-based targets may provide a measure of programme loudness and/or dialogue loudness. The programme loudness can be specified as an average of short-term integrated mean-square energy for audio frames of input audio. For example, the ITU-1770 standard specifies a short-term integrated K-weighted mean-square energies for input audio, where integration is done for 100 msec overlapping audio frames and 400 msec long windows. As another example, a dialogue gated loudness can be specified as short-term integrated mean-square energy for audio frames of a dialogue stem.

Other energy-based targets may be based on a spectral contrast (e.g., measure of energy of frequency at each time point within audio), a dynamic range (e.g., range between loudest and quietest peaks for some time window), and the like. In some instances, a combination or set of targets may be specified. For example, a set of targets may specify that ITU-1770 programme loudness must be −24 Loudness units relative to Full Scale (LUFS), dialogue gated loudness must be −27 LUFS, max short term loudness (STL) less than −20 LUFS and loudness range (LRA) less than 20 dB LU. In general the energy-based targets can be defined as some target spectral energy and/or energy distribution for an input audio such as a PCM audio.

Operation 120 includes obtaining a first version of a sound mix including one or more audio components. The sound mix may have been created for a media content such as a movie or television/episodic series.

The one or more audio components can include one or more submixes or PCM stems 10. For example, the first version of the sound mix can include a dialogue stem or submix, a music stem or submix, and a sound effects stem or submix, where the assembled sound mix comprises the three stems mixed together. The first version of the sound mix can be in a PCM format.

Figure 2:
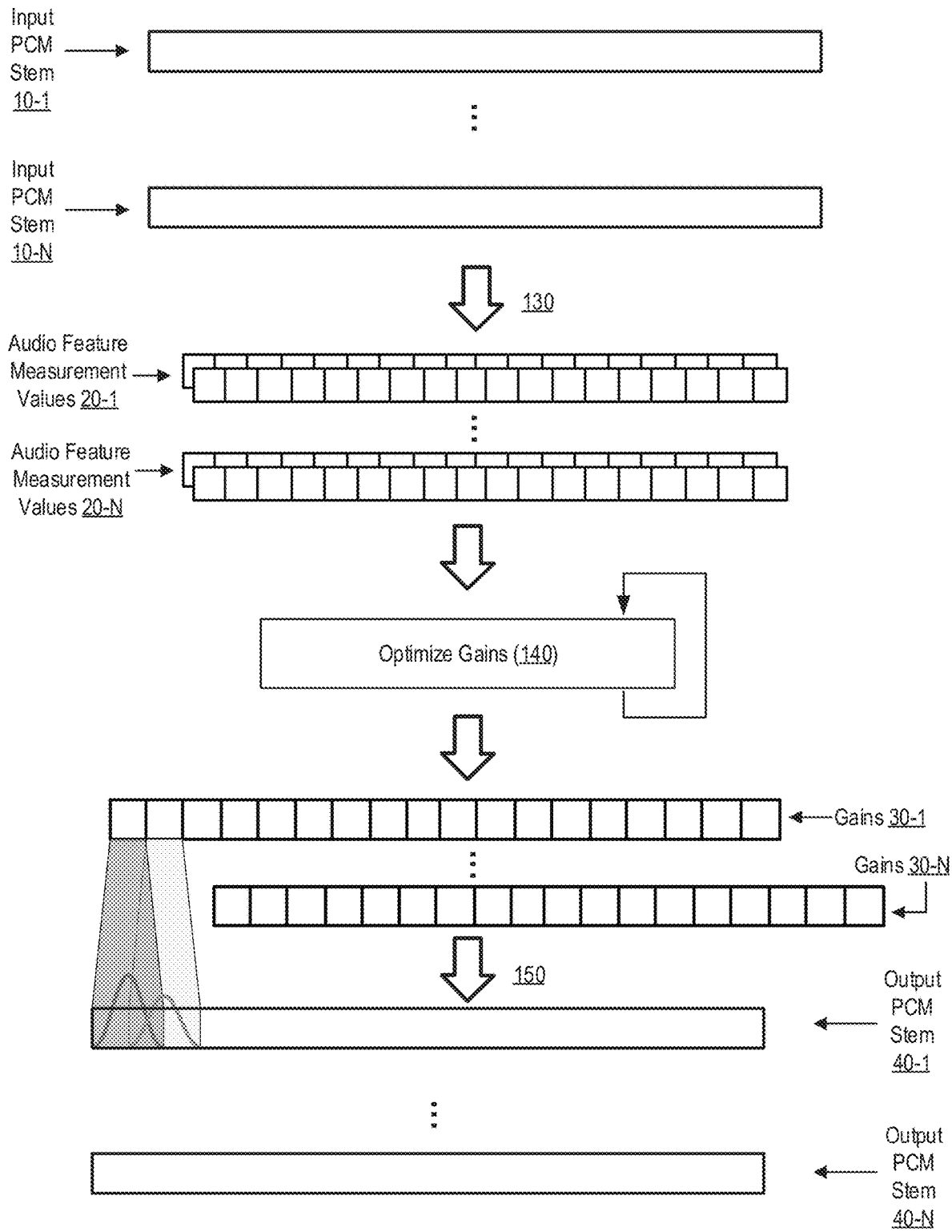
FIG. 2 conceptually illustrates a particular implementation of the method of FIG. 1 with multiple energy-based targets and a sound mix having multiple stems.

Operation 130 includes computing, for each audio frame of multiple audio frames of each audio component, one or more audio feature measurement values. For example, as depicted by FIG. 2, sets of audio feature measurement values 20-1 to 20-N are respectively computed for PCM stems 10-1 to 10-N. In the example of FIG. 2, first and second audio feature measurement values are computed for each audio frame (depicted as a square) of each PCM stem 10. However, in other implementations one audio feature measurement value is computed for each audio frame, or more than two audio feature measurement values are computed for each audio frame. The one or more audio feature measurement values can be stored as a one-dimensional or multi-dimensional array of values, where each entry of the array corresponds to an audio feature measurement value for an audio frame of an audio component.

The one or more audio feature measurement values can include one or more values needed to determine, during optimization, whether the sound mix meets the one or more energy-based targets. To that end, the one or more audio feature measurement values can include at least one energy measurement value. For example, a short-term energy can be computed for each audio frame. As another example, a range between a highest and lowest energy can be computed for each audio frame. In addition, the one or more audio feature measurement values can optionally include measurement values for other audio features that are not necessarily energy-based such as a value (e.g., a binary value) indicating the presence or absence of dialogue (or some other type of sound such as a special effect) in a given audio frame. The one or more audio feature measurement values can be precomputed once before an iterative optimization process, and cached for reuse throughout optimization.

Prior to performing operation 130, each audio component may be divided into multiple audio/time frames, each audio/time frame corresponding to a time range or window within the audio component. For example, when considering the audio frames in sequence, the beginning audio frame of the audio component can range from time 0 to time $t_1$, the next audio frame can range from time $t_1$ to $t_2$, the nth audio frame of the audio component can range from time $t_{n-1}$ to time $t_n$, etc.

The length of each audio frame can be configured and depend on one or more parameters, including: the resolution at which gains are optimized (further described below), the desired precision at which gains are optimized, and/or processing overhead. For example, the smaller the time range of each audio frame, and hence the greater the number of audio frames, the more time it may take to perform method 100. Conversely, the larger the time the time range of each audio frame, and hence the fewer the number of audio frames, the less time it may take to perform method 100, but at the potential cost of precision in the gain calculations. In some implementations, the time range of each audio frame is chosen as being less than or equal to the minimum time frame of the one or more energy-based targets. For example, if one energy-based target requires mean-square energies for input audio to be integrated over 100 ms time windows, and another energy-based target requires some energy measurement to be performed over 200 ms time windows, the length of each audio frame can be selected as being 100 ms or less.

Operation 140 includes optimizing, based at least on the one or more energy-based targets and the audio feature measurement values, gain values of the audio frames. For example, as depicted by FIG. 2, sets of gains 30-1 to 30-N (collectively, "gains 30") are respectively computed for PCM stems 10-1 to 10-N. As described herein a "gain" or "gain value" can refer to a linear multiplying or scaling coefficient (e.g., scaler) that can be applied.

A global numerical optimization can be performed (e.g., using common automatic differentiation frameworks) where a gain is optimized for each audio/time frame of each audio component until the desired one or more energy-based targets are reached. In implementations, further described below, the optimization may be performed by iteratively minimizing a loss function based on the one or more energy-based targets. The energy measurement values of the audio feature values can be updated, based on computed gain values, during each iteration. During each iteration, the gains can be updated and applied to update the energy measurement values of the audio frames to obtain new energy measurement values E', and these new energy measurement values can be used to compute the loss. The gains can be optimized on a dB scale such that given an energy E for a given frame, $E'=E \times 10^{gain/10.0}$. The energies E may be precomputed in the linear domain so that they can be integrated before going to logscale to compute the loudness LUFS targets. The gain values can also be post-filtered (e.g., smoothed) differently for different stems (e.g., smoother for dialogue and music stems, than special effects stems) prior to computing E'. The smoothing can be applied before E' is computed, in which case $E'=E \times 10^{smoothing(gain)/10.0}$.

Where multiple targets are optimized for, the loss function can include a weighted sum of functions based on respective energy targets. The weights can be varied to prioritize certain targets. For example, targets prescribed by law or regulation can be prioritized over targets prescribed by a streaming platform or other targets, including, for example, a target to preserve an original energy balance of the mix.

In implementations where the sound mix includes multiple audio components (e.g., multiple stems), the optimization may also target preservation of a relative balance of energies between the different audio components. In such implementations, prior to performing the optimization, method 100 may additionally include computing a relative energy balance between the multiple audio components (e.g., stems). For example, as further described below, a balance of short-term energies between stems can be calculated. During optimization of the gain values in such implementations, the optimization can be configured to meet certain energy-based targets (e.g., as prescribed in one or more specifications) while minimizing the change in the relative energy balance.

The optimized gain values can be stored as a one-dimensional or multi-dimensional array of values, where each entry of the array corresponds to an optimized (and optionally smoothed) gain value for an audio frame of an audio component.

Operation 150 includes applying the optimized gain values to the first version of the sound mix to obtain a second version of the sound mix. The optimized gain values can be applied directly to the samples (e.g., PCM samples) of the first version of the sound mix. For example, each gain value can be applied to the PCM samples over each audio frame. For example, application of an optimized gain value G to a given sample PCM to obtain PCM' may be based on Equation (1):

$$PCM' = 10^{\frac{G}{20}} \times PCM \qquad (1)$$

To avoid audible artifacts due to the gain values being discontinuous or not smooth enough from frame to frame, a linear interpolation or overlap-add reconstruction (e.g., as depicted in FIG. 2) can be implemented when applying the gain values to the PCM samples over the duration of the frame. For example, as depicted by FIG. 2, an overlap-add process is used to apply sets of gains 30-1 to 30-N to respective input PCM stems 10-1 to 10-N to generate respective output PCM stems 40-1 to 40-N.

To illustrate a particular example of method 100, consider the case where method 100 is implemented to modify a PCM sound mix to adhere to both dialogue and programme loudness targets/metrics. Also assume that the sound components of the PCM sound mix are three independent stems: dialogue, sound effects, and music tracks that are separately available. As the input PCM sound mix can be close to the dialogue target, a global gain shift can be applied to the original PCM audio to bring the content to that target prior to computing one or more energy measurement values and running the optimization (operation 140). For example, if the measured input dialogue loudness is −26 LUFS and the desired target is −27 LUFS, a global 1 dB gain reduction can be applied to all S stems.

In this example, the following metrics (i.e., audio feature measurement values) can be precomputed at operation 130 prior to optimization: short-term integrated K-weighted mean-square energies, E(s, t), and a dialogue mask. The short-term integrated K-weighted mean-square energies can be represented as E(s, t), where s is a given stem, and t is a given time. To compute E(s, t), integration can be done over 100 ms overlapping audio frames, over 400 ms long windows, in accordance with the ITU-1770 standard. In other implementations, the length of the audio frames and/or the length of the integration window can be different. In addition, a dialogue mask can be computed for each frame (e.g., each 100 ms audio frame) as a boolean mask, Dmask(t), indicating the presence or absence of dialogue. Dmask(t) can be computed on the PCM mixture of all input stems to adhere to the standards for dialogue loudness measurement. Alternatively, Dmask(t) can be computed on the dialogue stem.

Following determination of E(s, t) and Dmask(t), the overall loudness of the program can be approximated by averaging the short-term energies of all the audio frames while the dialogue loudness can be approximated by averaging the energies of the audio frames identified as containing dialogue, e.g., as per the ITU standards/recommendations.

During optimization (operation 140) in this particular example, a global numerical optimization can be performed where a gain is optimized for each audio/time frame of each stem until the desired target loudness values are reached. For example, for a one-hour long material, corresponding to 36000 audio frames (100 ms each) and S=3 stems, a resulting 3×36000=108000 gain values can be optimized. These gain values can be stored in an array containing the 108000 gain values.

In this particular example, once the short-term gains for each audio frame of each stem has been determined via the numerical optimization process, they can be applied (operation 150) to the original PCM audio using an overlap-add process to avoid any undesirable artefacts.

In the foregoing example, it is assumed that the S stems are uncorrelated in which case the loudness values can be computed by summing the energies directly rather than summing waveforms and recomputing the short-term energies. This can greatly improve performance as operating on short-term energies reduces the input data from the audio sampling rate (e.g., 48000 values per second) to a rate that depends on the size of the audio frames (e.g., 10 values per second for 100 ms audio frames). During practice, it was observed that this assumption was valid and a difference of only ~0.1 dB was observed on the final target loudness.

Figure 3:
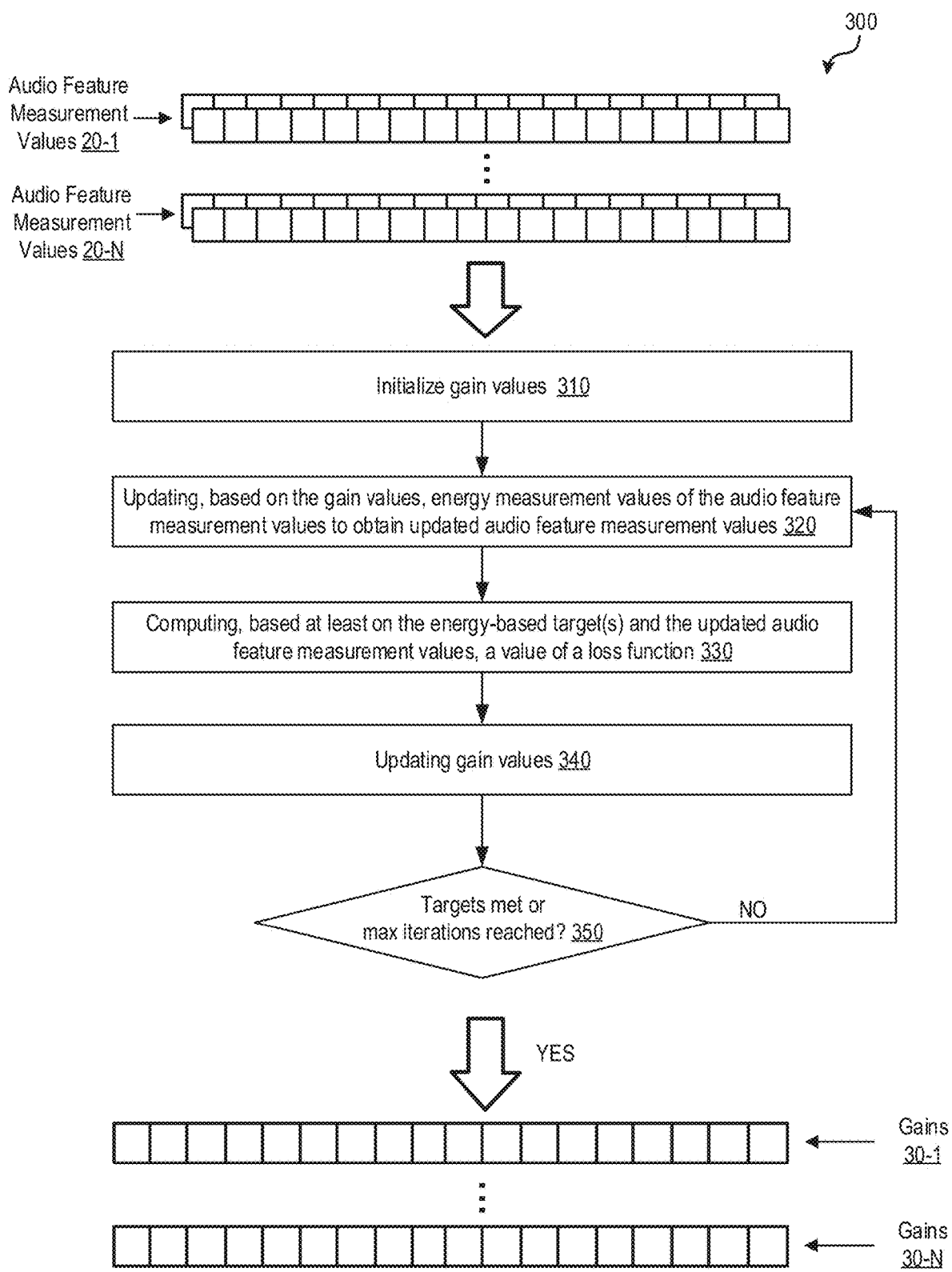
FIG. 3 is a flow diagram illustrating an example method of optimizing gains of audio frames based on based on one or more energy-based targets and audio feature measurement values, in accordance with some implementations of the disclosure.

FIG. 3 is a flow diagram illustrating an example method 300 of optimizing gains 30 of audio frames based on one or more energy-based targets and audio feature measurement values 20, in accordance with some implementations of the disclosure. For example, method 300 can correspond to operation 140 of method 100.

Operation 310 includes initializing the gain values. Thereafter the following operations can be iteratively performed, e.g., until a loss function is minimized.

Operation 320 includes updating, based on the gain values, energy measurement values of the audio feature measurement values to obtain updated audio feature measurement values.

Operation 330 includes computing, based at least on the energy-based target(s) and the updated audio feature measurement values, a value of a loss function.

Operation 340 includes updating the gain values. The gain values can be updated based on the current gain values.

At decision 350, it is determined if the energy-based targets have been met or if a maximum number of iterations in the optimization procedure have been reached. If yes, the current gain values are used as the output. If not, the optimization can continue to iterate.

To illustrate a particular example of an optimization of gain values, it is instructive to consider the example where a PCM sound mix is modified to adhere to both dialogue and programme loudness targets/metrics. In addition to adhering to both dialogue and programme loudness targets/metrics, the optimization may be configured to preserve the original balance of the sound mix. To do so, a mix "color" metric that measures the relative energy balance/ratio between all S stems may be introduced. The short term "color", C(s,t) may be computed using any array of short term K-weighted mean square energies E(s, t) based on Equations (2) and (3):

$$A(s, t) = \sum_{t-w/2}^{t+w/2} E(s, t)^p \quad (2)$$

$$C(s, t) = A(s, t) / \sum_{s=0}^{s} A(s, t) \quad (3)$$

Where w is the integration window in frames (e.g., w=19), and typically the exponent p=1.

The aforementioned optimization can use a numerical gradient descent algorithm such as Adam to minimize a loss function defined by Equation (4):

$$E'(s,t) = 10^{\frac{G(s,t)}{10}}.$$

Where $$\text{LOSS} = \quad (4)$$

$$\text{alpha1} * \text{Loss1}(maskedLoudness(E'(s, t), Dmask(t)), dialogueTarget) +$$

$$\text{alpha2} * \text{Loss2}(progLoudness(E'(s, t)), progTarget) +$$

$$\text{alpha3} * \text{Loss3}(IC(s, t), OC(s, t)) + \text{alpha4} * \text{Loss4}(G(s, t), 0)$$

E(s, t) are the short term energies after applying the short-term gains at each iteration; G(s, t) are the optimized short-term gains (in dB) at each iteration; IC(s, t) is the original color of the mix (i.e., computed on E(s, t)); and OC(s, t) is the color of the mix after the gains are applied (i.e., computed on E'(s, t)). The loss functions may be L1, MSE or LogCosh losses and the alpha_i are weights that can be adjusted to fine tune the optimization process (e.g., to prioritize certain targets). dialogueTarget is the desired dialogue target loudness (e.g., −27 LUFS) while progTarget is the desired programme target loudness (e.g., −24 LUFS).

In some implementations, the dialogue loudness may be optimized such that it is matched exactly to a given target and the programme loudness such that its difference to the dialogue loudness is below a given threshold T. This optimization may be performed by using a loss term of the form: Rect(−T+(progLoudness( . . . )−maskedLoudnes( . . . )), where Rect is a rectifier function such as ReLU or SoftRelu.

Contrary to short-term PCM-domain dynamic range compression approaches, the aforementioned optimization may consider the entirety of the content over all S input stems at once and also offer an explicit control of the mix balance via the color metric and associated loss function. An optional regularization term may also be included that minimizes the overall gain changes applied to the original content.

The aforementioned optimization can be implemented using commonly available frameworks such as PYTORCH, TENSORFLOW, etc., that offer, for example, tensor manipulation primitives, automatic differentiation, and GPU hardware acceleration.

Although the foregoing example illustrates examples of particular target terms that can be considered in the optimization function, it should be appreciated that, depending on the application, certain target terms may be excluded and/or other target terms may be added. For example, in some implementations a loudness range (LRA) can be a target term in the loss function for further control of the audio's dynamic range. The LRA may be specified as maximum allowed values rather than values that need to be met exactly. To implement the LRA target in the loss function, a loss term of the following form can be added: Rect(Softmax (shortTermLoudness(E'(s,t))−target), where Rect is a rectifier function such as ReLU or SoftRelu and Softmax is a soft differentiable approximation to the max value of L.

In the foregoing examples, by virtue of optimizing in a down sampled audio feature domain (i.e., a space quantized to audio frames) as opposed to the level of PCM samples, the optimization can be done relatively quickly. Assuming all PCM samples across channels/stems are decorrelated, which is generally a reasonable assumption, the process is linear, and the process of applying gains on energy can be equivalent to applying them on the PCM samples. As such, generally speaking, as long as what is done to the PCM samples can be mapped to the down sampled feature/energy-value domain loss (or approximated), optimization can be performed in the down sampled space, and the optimized results can thereafter be applied to the PCM samples of the sound mix.

In some implementations, the techniques described herein can be used to "transfer" the energy balance/"color" of a reference mix to a target mix by using the energy balance values of the reference mix (e.g., C(s,t)) instead of the ones of the input target mix during the optimization. For example, the C(s,t) values of the reference mix can be used as IC(s,t) in the color loss term during the optimization. This may be particularly useful, for instance, to transfer the energy balance of multiple audio components (e.g., dialogue, music, and sound effects stems) of a mix in a first language (e.g., domestic mix) on a mix in a second language (e.g., a foreign dub) of the same movie or show while at the same time meeting other energy-based targets (e.g., loudness requirements).

Figure 4:
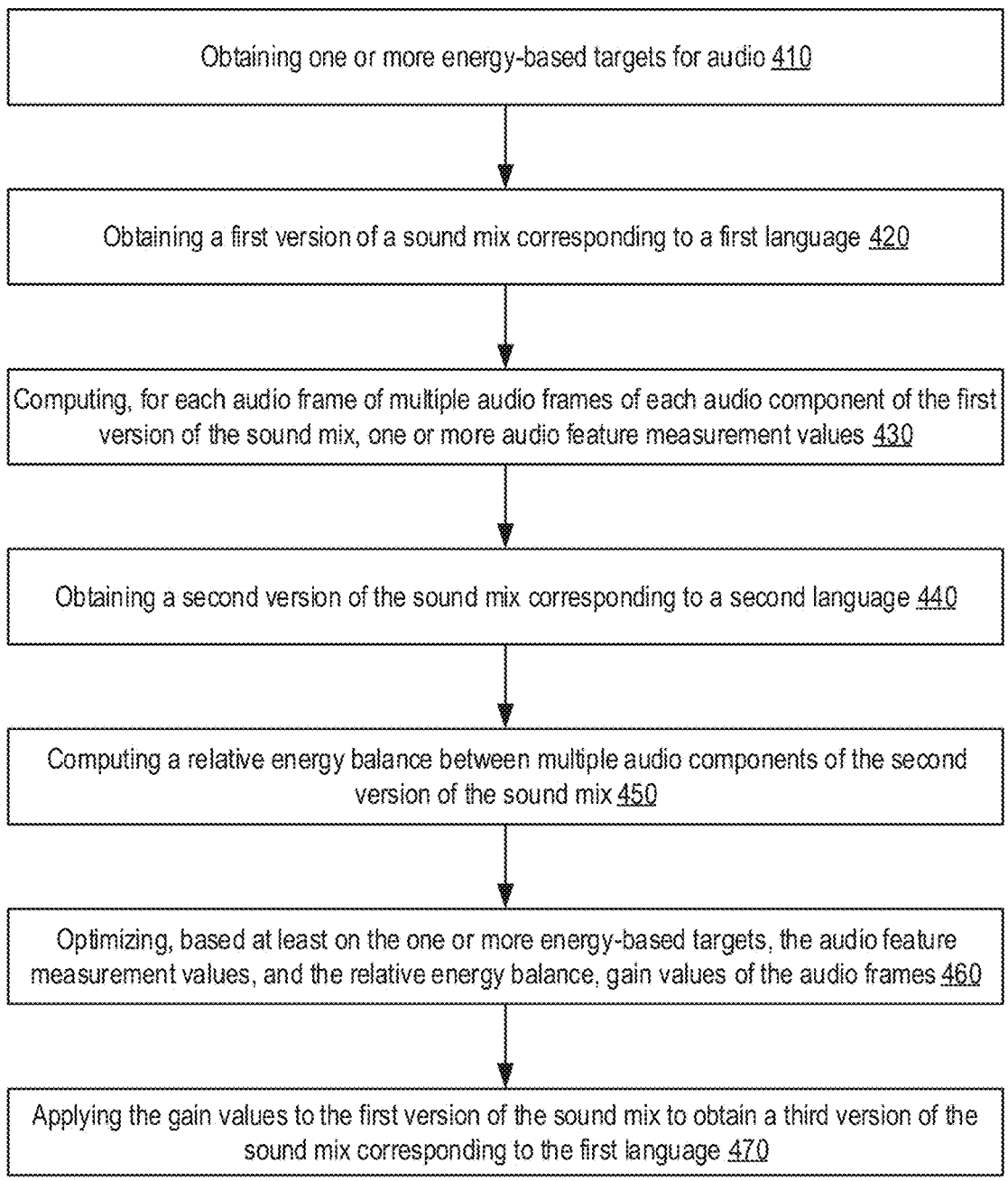
FIG. 4 is a flow diagram illustrating an example method of deriving a third version of a sound mix in a first language from a first version of the sound mix in the first language, given one or more energy-based targets for audio, and an energy balance of a second version of the sound mix in a second language, in accordance with some implementations of the disclosure.

To illustrate the "transfer" of an energy balance of a reference mix to a target mix, FIG. 4 is a flow diagram illustrating an example method 400 of deriving a third version of a sound mix in a first language from a first version of the sound mix in the first language, given one or more energy-based targets for audio, and an energy balance of a second version of the sound mix in a second language, in accordance with some implementations of the disclosure. In this example, each of the first version, the second version, and the third version of the sound mix includes multiple audio components. For example, each sound mix can include a dialogue stem, a music stem, and a sound effects stem.

Operation 410 includes obtaining one or more energy-based targets for audio. Operation 420 includes obtaining a first version of a sound mix corresponding to a first language. For example, the first version of the sound mix may be a foreign dub of a film originally mixed in English (e.g., a foreign dub in French, German, Spanish, Mandarin, Korean, or Japanese). Operation 430 includes computing, for each audio frame of multiple audio frames of each audio component of the first version of the sound mix, one or more audio feature measurement values. Operation 440 includes obtaining a second version of the sound mix corresponding to a second language. For example, for a domestic film of an English-speaking country, the second version of the sound mix may correspond to a domestic mix in English.

Operation 450 includes computing a relative energy balance between multiple audio components of the second version of the sound mix. For example, C(s,t) may be calculated for a domestic mix following the techniques described above. In some implementations, the energy balance may be calculated on an original mix of the second language. In other implementations, the energy balance may be calculated on a mix of the second language after it is adjusted for one or more energy-based targets as described above with reference to method 100.

Operation 460 includes optimizing, based at least on the one or more energy-based targets, the audio feature measurement values, and the relative energy balance, gain values of the audio frames 460. For example, the C(s,t) values of the second version of the sound mix in the second language can be used as IC(s,t) in the color loss term during the optimization. Operation 470 includes applying the gain values to the first version of the sound mix to obtain a third version of the sound mix corresponding to the first language (e.g., French, German, Spanish, Mandarin, Korean, or Japanese).

Figure 5:
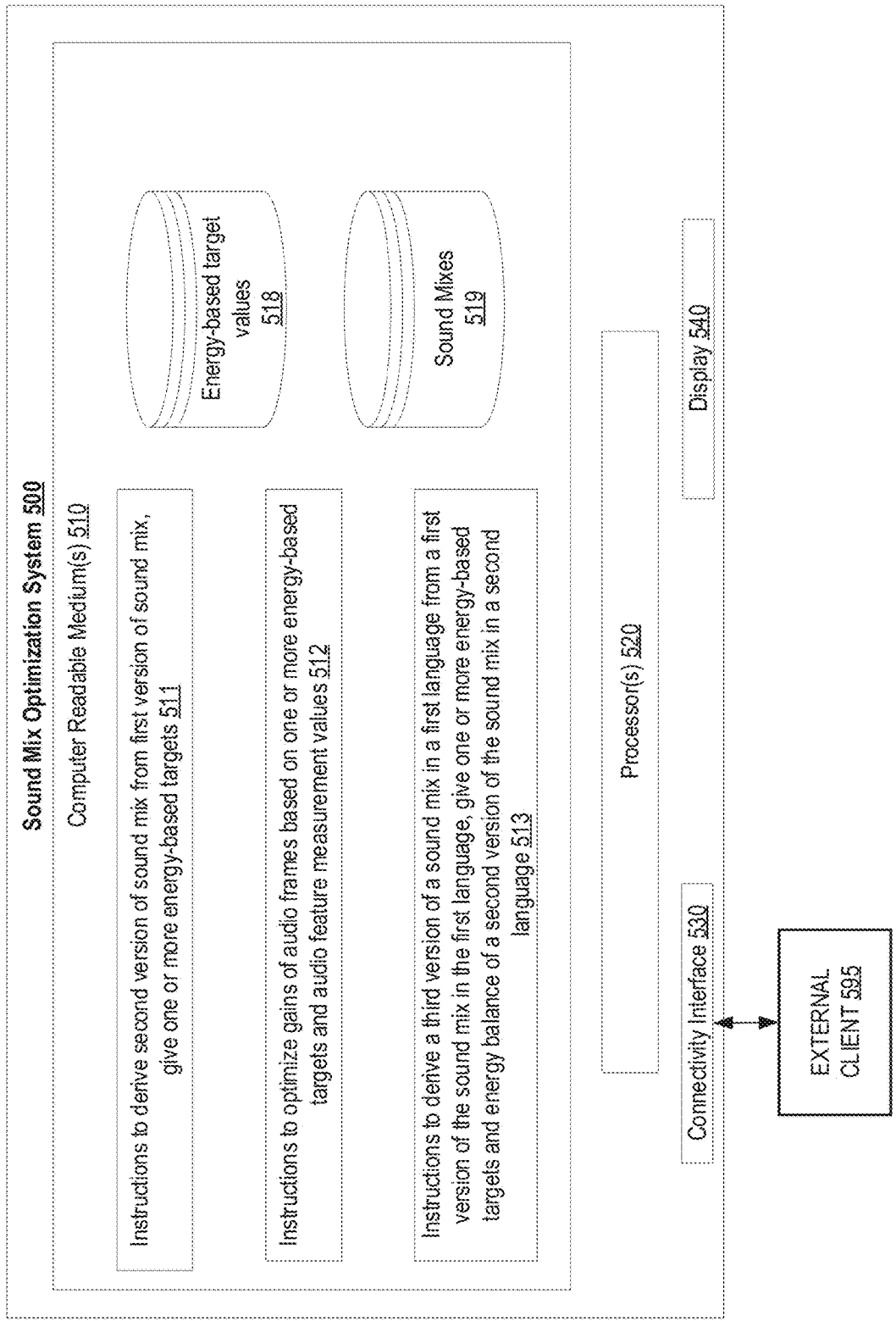
FIG. 5 is a block diagram illustrating a sound mix optimization system, in accordance with some implementations of the disclosure.

FIG. 5 is a block diagram illustrating a sound mix optimization system 500 that may implement the techniques described in the present disclosure. System 500 may implemented as one or more servers and/or one or more client devices. In some implementations, the components of system 500 may be distributed over a communications network.

The sound mix optimization system 500 comprises at least one computer readable medium 510 upon which are stored instructions that, when executed by a processor 520, cause sound mix optimization system 500 to carry-out implementations of the disclosure. Sound mix optimization system 500 further comprises, at least one processor 520, a connectivity interface 530, and a display 540. In this example, at least one computer readable medium 510 includes a datastore of energy-based target values 518 and a datastore of previously created sound mixes 519. Datastores 518-519 may be accessed during execution of instructions, further discussed below.

The at least one computer readable medium 510 also stores instructions 511 that, when executed by a processor 520, cause sound mix optimization system 500 to derive a second version of a sound mix from a first version of the sound mix, given one or more energy-based targets. For example, execution of instructions 511 may cause system to perform some or all operations of method 100. The at least one computer readable medium 510 also stores instructions 512 that, when executed by a processor 520, cause sound mix optimization system 500 to optimize gains of audio frames based on one or more energy-based targets and audio feature measurement values. For example, execution of instructions 511 may cause system to perform operation 140, or some or all operations of method 300. The at least one computer readable medium 510 also stores instructions 513 that, when executed by a processor 520, cause sound mix optimization system 500 to derive a third version of a sound mix in a first language from a first version of the sound mix in the first language, give one or more energy-based targets and energy balance of a second version of the sound mix in a second language. For example, execution of instructions 513 may cause system to perform some or all operations of method 400.

In some implementations, one or more of instructions 511-513 may be integrated as part of a media editing application such as a sound editing application. For example, instructions 511-513 may be executed as part of a sound editing application that is run on a desktop or mobile device. In some cases, one or more of the instructions may be executed by a server system that provides a cloud-based or web-based application for sound editing.

Connectivity interface 530 is configured to provide sound mix optimization system 500 with wired and/or wireless communication with one or more external clients 595 via a direct and/or indirect connection over one or more communication networks.

Display 540 may be used to present an editable sound mix session or other data associated with a media editing application.

In this document, the terms "machine readable medium," "computer readable medium," and similar terms are used to generally refer to non-transitory mediums, volatile or non-volatile, that store data and/or instructions that cause a machine to operate in a specific fashion. Common forms of machine readable media include, for example, a hard disk, solid state drive, magnetic tape, or any other magnetic data storage medium, an optical disc or any other optical data storage medium, any physical medium with patterns of holes, a RAM, a PROM, EPROM, a FLASH-EPROM, NVRAM, any other memory chip or cartridge, and networked versions of the same.

These and other various forms of computer readable media may be involved in carrying one or more sequences of one or more instructions to a processing device for execution. Such instructions embodied on the medium, are generally referred to as "instructions" or "code." Instructions may be grouped in the form of computer programs or other groupings. When executed, such instructions may enable a processing device to perform features or functions of the present application as discussed herein.

In this document, a "processing device" may be implemented as a single processor that performs processing operations or a combination of specialized and/or general-purpose processors that perform processing operations. A processing device may include a CPU, GPU, APU, DSP, FPGA, ASIC, SOC, and/or other processing circuitry.

The various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

Each of the processes, methods, and algorithms described in the preceding sections may be embodied in, and fully or partially automated by, instructions executed by one or more computer systems or computer processors comprising computer hardware. The processes and algorithms may be implemented partially or wholly in application-specific circuitry. The various features and processes described above may be used independently of one another, or may be combined in various ways. Different combinations and sub-combinations are intended to fall within the scope of this disclosure, and certain method or process blocks may be omitted in some implementations. Additionally, unless the context dictates otherwise, the methods and processes described herein are also not limited to any particular sequence, and the blocks or states relating thereto can be performed in other sequences that are appropriate, or may be performed in parallel, or in some other manner. Blocks or states may be added to or removed from the disclosed example embodiments. The performance of certain of the operations or processes may be distributed among computer systems or computers processors, not only residing within a single machine, but deployed across a number of machines.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. A non-transitory computer-readable medium having executable instructions stored thereon that, when executed by a processor, cause a system to perform operations comprising:
    obtaining a first energy-based target for audio;
    obtaining a first version of a sound mix including multiple audio components, the first version of the sound mix corresponding to a first language;
    computing, for each audio frame of multiple audio frames of each of the audio components, a first audio feature measurement value;
    computing a relative energy balance between multiple audio components of a second version of the sound mix corresponding to a second language;
    optimizing, based at least on the first energy-based target, the first audio feature measurement values, and the relative energy balance, gain values of the audio frames; and
    after optimizing the gain values, applying the gain values to the first version of the sound mix to obtain a third version of the sound mix.

2. The non-transitory computer-readable medium of claim 1, wherein:
    the first version of the sound mix comprises first pulse-code modulation (PCM) audio;
    the third version of the sound mix comprises second PCM audio; and
    applying the gain values to the first version of the sound mix comprises scaling multiple PCM samples of each of the audio frames based on a respective one of the gain values.

3. The non-transitory computer-readable medium of claim 2, wherein applying the gain values to the first version of the sound mix further comprises applying the gain values using a linear interpolation or overlap-add process.

4. The non-transitory computer-readable medium of claim 2, wherein each of the audio frames has a length of at least 1 millisecond.

5. The non-transitory computer-readable medium of claim 1, wherein:
    the first audio feature measurement value is a weighted short-term energy; and
    computing the first audio feature measurement value for each of the audio frames, comprises:
    computing the weighted short-term energy by integrating energy over a time window including at least the audio frame and an adjacent audio frame.

6. The non-transitory computer-readable medium of claim 1, wherein the operations further comprise: dividing each of the audio components into the multiple audio frames, the multiple audio frames each having a length of at least 1 millisecond.

7. The non-transitory computer-readable medium of claim 1, wherein the operations further comprise: prior to optimizing the gain values, applying a global gain shift to each of the multiple audio frames.

8. The non-transitory computer-readable medium of claim 1, wherein optimizing the gain values, comprises: minimizing a change in the relative energy balance while meeting the first energy-based target.

9. The non-transitory computer-readable medium of claim 1, wherein:

the multiple audio components comprise a first dialogue stem, a first music stem, and a first sound effects stem; and the third version of the sound mix comprises a second dialogue stem, a second music stem, and a second sound effects stem.

\* \* \* \* \*